United States Patent [19]
Yamazaki et al.

[11] Patent Number: 5,897,706
[45] Date of Patent: Apr. 27, 1999

[54] METHODS FOR CRUCIBLE ATTACHMENT TO SUPPORT BASE OF SINGLE CRYSTAL PULLING APPARATUS AND SUPPORT BASE ASSEMBLY APPARATUS AND SUPPORT BASE EMPLOYED THEREIN

[75] Inventors: Masakazu Yamazaki; Michio Yanaba; Hiroaki Taguchi; Takashi Atami; Hisashi Furuya, all of Tokyo, Japan

[73] Assignees: Mitsubishi Materials Silicon Corporation; Mitsubishi Materials Corporation, both of Tokyo, Japan

[21] Appl. No.: 08/834,293

[22] Filed: Apr. 15, 1997

[30] Foreign Application Priority Data

May 20, 1996 [JP] Japan .................................. 8-125031

[51] Int. Cl.⁶ .................................................. C30B 15/10
[52] U.S. Cl. ........................... 117/200; 117/208; 117/213; 117/900
[58] Field of Search ..................................... 117/200, 208, 117/213, 900

*Primary Examiner*—Felisa Hiteshew
*Attorney, Agent, or Firm*—Pillsbury Madison & Sutro LLP

[57] ABSTRACT

An improvement in the safety, ease and speed with which the operation of attaching a crucible 1 to a support base 10 of a single crystal pulling apparatus can be completed is provided. With the method of attaching the crucible 1 to the support base 10, the support base 10 is divided into a support base bottom portion 11 and a support base drum portion 12 which is fitted to the bottom portion 11, and the crucible 1 is mounted on the support base bottom portion 11. The support base 10 is then assembled by fitting the support base drum portion 12 to the support base bottom portion 11.

5 Claims, 3 Drawing Sheets

METHODS FOR CRUCIBLE ATTACHMENT TO SUPPORT BASE OF SINGLE CRYSTAL PULLING APPARATUS AND SUPPORT BASE ASSEMBLY APPARATUS AND SUPPORT BASE EMPLOYED THEREIN

FIELD OF THE INVENTION

The present invention relates to a method of attaching a crucible to a support base of a single crystal pulling apparatus in which the operation of attaching the crucible to the support base of the single crystal pulling apparatus can be completed simply and quickly, and to a support base assembly apparatus and a support base employed in the method described.

DESCRIPTION OF THE RELATED ART

Single crystal pulling apparatus are devices in which a semiconductor source material such as silicon is converted to a semiconductor melt inside a crucible, and a single crystal of semiconductor is then pulled up and grown from the semiconductor melt, and the crucible employed in the growing of single crystals of silicon for example, needs to be formed from quartz, a compound of silicon and oxygen. The quartz crucible will not always display sufficient rigidity during the process of pulling the single crystal of silicon, and so single crystal pulling apparatus are equipped with a support base (known as a susceptor).

However, following the production of a single crystal of a semiconductor in a single crystal pulling apparatus, in order to prepare for production of the next single crystal of semiconductor, first the crucible and then the support base must be removed from inside the gas tight chamber which encloses the crucible of the single crystal pulling apparatus and the support base, and then any remaining semiconductor source material removed from the crucible in a clean room. Next, a new crucible must be attached to the support base, fresh semiconductor source material placed in the new crucible, a lid placed on the crucible, the assembly transported to and placed inside the gas tight vessel of the single crystal pulling apparatus, and the support base and the crucible then fitted in place.

In this series of operations, the operation of attaching the crucible to the support base currently involves operators holding the upper edge of the crucible and then lowering the crucible down inside the support base.

However, conducting the operation of attaching the crucible to the support base in this manner means that the entire weight of the crucible needs to be supported by holding the upper edge of the crucible, and so particularly in those cases where large crucibles are employed to produce large diameter single crystals of semiconductor, the operation becomes difficult and safety problems arise.

An object of the present invention is to provide a method of attaching a crucible to a support base of a single crystal pulling apparatus in which the operation of attaching the crucible to the support base of the single crystal pulling apparatus can be completed safely, simply and quickly, and a support base assembly apparatus and a support base for use in the method described.

SUMMARY OF THE INVENTION

To achieve the above object, the method of the present invention for attaching a crucible to a support base of a single crystal pulling apparatus which is equipped with a crucible for storing a semiconductor melt and a support base for supporting the crucible, is characterized in; partitioning the support base into a bottom portion, and a drum portion which can be attached to the bottom portion, mounting the crucible on the bottom portion, and subsequently assembling the support base by attaching the drum portion to the bottom portion.

This enables the crucible to be grasped by a middle or lower portion of a drum portion of the crucible during the mounting of the crucible on the bottom portion of the support base.

Another aspect of the present invention involves a support base assembly apparatus which is used in the method of the present invention for attaching a crucible to a support base of a single crystal pulling apparatus, which is characterized by incorporating a bottom portion mount on which the bottom portion of the support base is mounted, a drum portion mount on which the drum portion of the support base is mounted, and an approach drive mechanism for bringing the bottom portion mount and the drum portion mount together to thereby assemble the bottom portion and the drum portion of the support base.

This enables the operation of assembling the support base by attaching the drum portion to the bottom portion to be carried out simply and quickly.

Here an annular positioning recess may be formed in a bottom surface of the drum portion, and an annular engagement protrusion which engages with the annular positioning recess of the drum portion, and the inner face of which acts as a guide face which gradually widens in an upward direction, may be provided on the upper surface of the drum portion mount. Thus, by mounting the support base while engaging the annular positioning recess of the drum portion with the guide face of the engagement protrusion of the drum portion mount, the drum portion can be easily mounted in position.

Yet another aspect of the present invention involves a support base which is used in the method of the present invention for attaching a crucible to a support base of a single crystal pulling apparatus, which is characterized by incorporating a bottom portion, and a drum portion which has an engagement aperture into which the bottom portion fits, and an external engagement surface of the bottom portion and an engagement surface of the engagement aperture of the drum portion have sloping surfaces which are tapered in a downward direction.

This means that when the bottom portion and the drum portion are assembled by fitting the bottom portion into the engagement aperture of the drum portion, the drum portion is guided relative to the bottom portion by the sloping surfaces, and so the engagement can be completed simply and smoothly. Furthermore, once the two portions are fitted together, the sloping surfaces prevent the bottom portion from dropping down from the drum portion, and hence the support base can be carried by grasping the drum portion.

Here the drum portion of the support base may be constructed from a plurality of segments which divide the drum portion around the circumferential direction, so that the mounting of the drum portion on to the drum portion mount can be completed by first dividing the drum portion into the plurality of segments, and then assembling the segments to form a cylinder by mounting the segments one at a time onto the drum portion mount. Hence the operation can be lightened compared to the case where the very heavy drum portion is lifted and then mounted as one single portion.

DESCRIPTION OF THE PREFERRED EMBODIMENTS

Below is a description of the preferred embodiments of the present invention based on the drawings.

Figure 1:
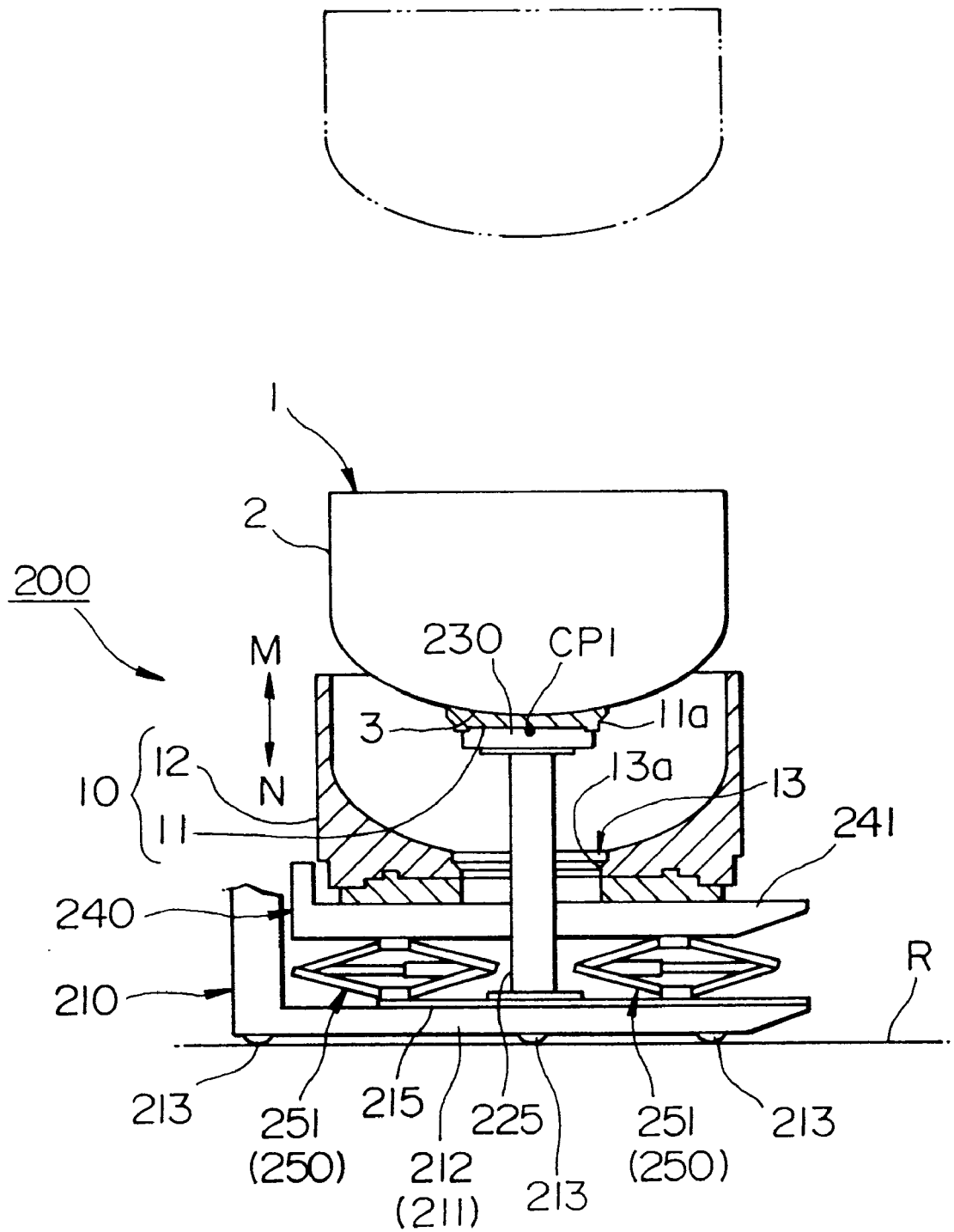
FIG. 1 is a side view of one embodiment of a support base assembly apparatus used in the method of the present invention for attaching a crucible to a support base of a single crystal pulling apparatus.

As shown in FIG. 1, a crucible 1 of an embodiment of a single crystal pulling apparatus of the present invention comprises a crucible drum portion 2 comprising a cylinder which is open at a top end, and a crucible bottom portion 3 comprising a downward facing convex spherical surface which closes off a bottom end of the crucible drum portion 2.

Figure 2:
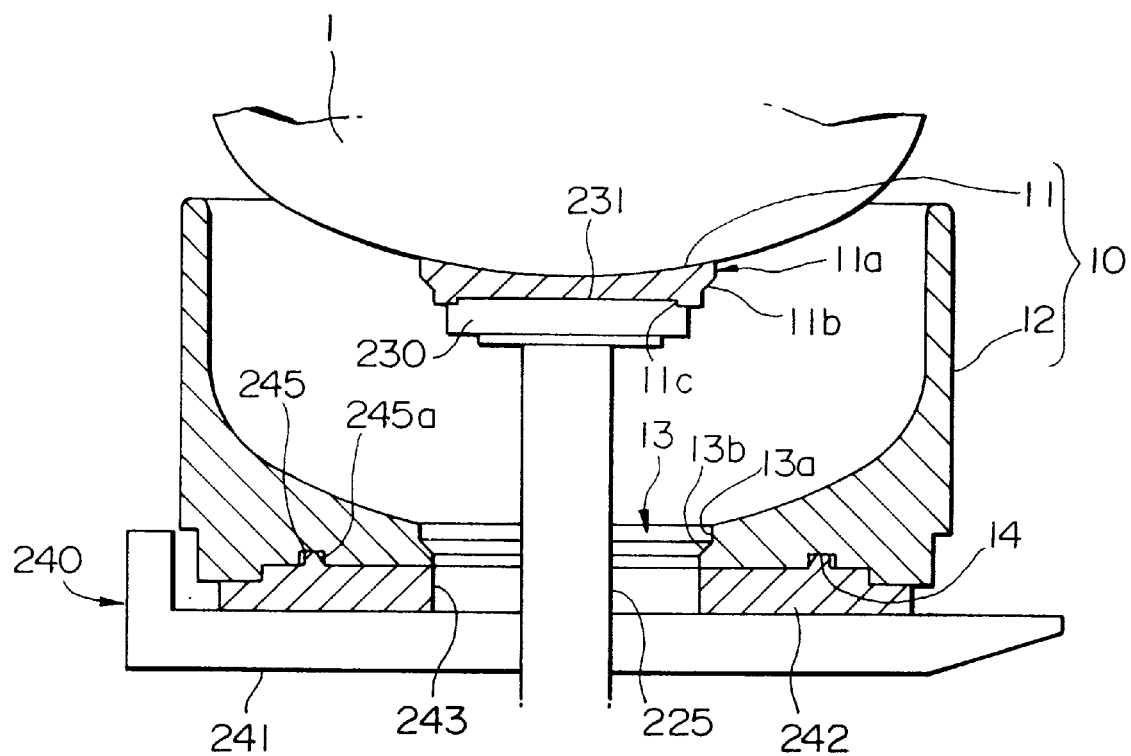
FIG. 2 is an enlarged view of the support base fitted to the support base assembly apparatus of FIG. 1.
Figure 3:
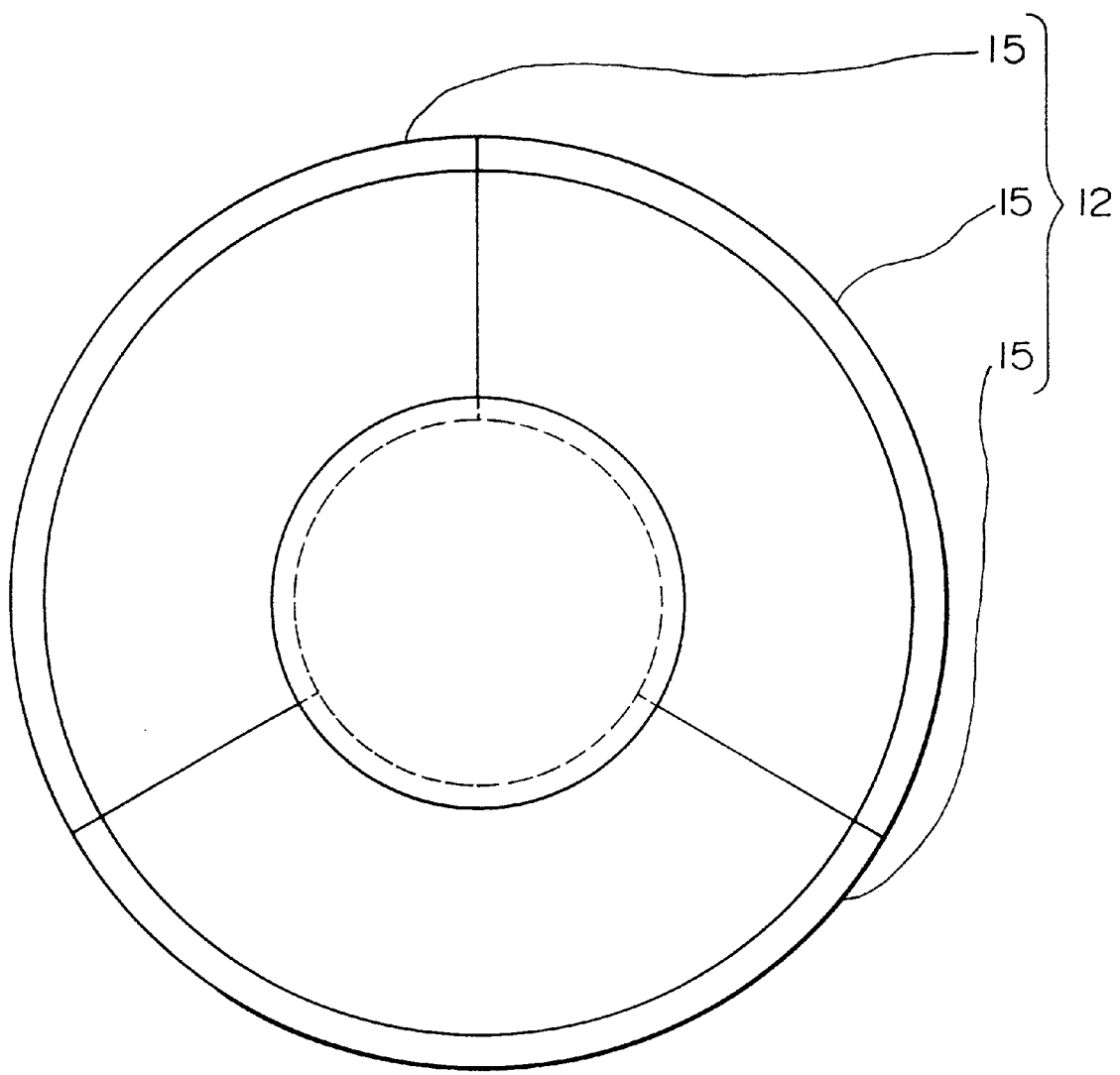
FIG. 3 is a plan view of the support base of FIG. 2.

A support base 10 is equipped with a support base bottom portion 11 comprising a circular plate which supports a central portion of the crucible bottom portion 3 of the crucible 1, and a drum portion 12 which contains a engagement aperture 13 into which the support base bottom portion 11 is fitted, and which supports the crucible peripheral portion of the bottom portion 3 of the crucible 1 as well as the drum portion 2 of the crucible 1, and as is shown in FIG. 2, an external engagement surface 11a of the support base bottom portion 11 and an engagement surface 13a of the engagement aperture 13 of the support base drum portion 12 contain sloping surfaces, 11b and 13b respectively, which are tapered in a downward direction. Furthermore, an annular positioning recess 14 is formed in the bottom surface of the support base drum portion 12 encircling the engagement aperture 13. Moreover, as is shown in FIG. 3, the support base drum portion 12 is made up of three segments 15 which are connected together in a horizontal peripheral direction. Furthermore the bottom surface of the bottom portion 11 shown in FIG. 2 comprises a positioning recess 11c.

As shown in FIG. 1, a support base assembly apparatus 200 is positioned on the floor R of a clean room. The support base assembly apparatus 200 is equipped with a free running base carriage 210, a support column 225 which is fitted to the base carriage 210, a bottom portion mount 230 which is fixed to the top end of the support column 225 and on which the bottom portion 11 of the support base 10 is mounted, a drum portion mount 240 on which the drum portion 12 of the support base 10 is mounted, and an approach drive mechanism 250 for moving the drum portion mount 240 in an upward direction (in the direction of the arrow M in the figure) so as to assemble together the bottom portion 11 and drum portion 12 of the support base 10.

The base carriage 210 is equipped with a main frame 211 and a plurality of wheels 213 which are fitted to the main frame 211. The main frame 211 has two parallel beams 212 and a support frame 215 which is built between the two parallel beams 212. The bottom portion mount 230 comprises a horizontal circular plate which is of smaller diameter than the bottom portion 11 of the support base 10 shown in FIG. 2.

The drum portion mount 240 has a U-shaped frame 241 with an open space in the center, and a circular plate main mount 242 which lies horizontally on top of the frame 241. An aperture 243 passes through a central portion of the main mount 242. The aforementioned support column 225 and the bottom portion mount 230 are able to pass through the aperture 243. The drum portion 12 of the support base 10 is mounted on the upper surface of the main mount 242 of the drum portion mount 240 so that the centerline of the engagement aperture 13 of the drum portion 12 is aligned with the centerline of the aperture 243 of the drum portion mount 240. An annular engagement protrusion 245 for engaging with the annular positioning recess 14 on the bottom surface of the drum portion 12 of the support base 10, is provided on the upper surface of the main mount 242 of the drum portion mount 240. The inner face of the engagement protrusion 245 comprises a guide face 245a which gradually widens in an upward direction. The bottom portion mount 230 contains a positioning protrusion 231 which engages with the recess 11c in the bottom portion 11 of the support base 10.

The drive mechanism 250 shown in FIG. 1 is positioned between the main frame 211 of the base carriage 210 and the frame 241 of the drum portion mount 240, and has hydraulic jacks 251 which can be freely extended and retracted in a vertical direction.

Below is a description of the method of attaching the crucible 1 to the support base 10 using the support base assembly apparatus 200.

First the main mount 242 is raised up, and with the bottom portion 11 and the drum portion 12 of the support base 10 assembled together, the support base 10 is positioned on the support base assembly apparatus 200.

When positioning the support base 10 on the support base assembly apparatus 200, the bottom portion 11 of the support base 10 is mounted on the bottom portion mount 230 of the support base assembly apparatus 200 with the center of the bottom portion 11 aligned with the center CP1 of the bottom portion mount 230, and the drum portion 12 of the support base 10 is mounted on the drum portion mount 240 of the support base assembly apparatus 200 so that the drum portion 12 encircles the bottom portion mount 230. Next, the drum portion 12 of the support base 10 is lowered together with the drum portion mount 240, opening up an upper space around the bottom portion 11.

When mounting the drum portion 12 of the support base 10 onto the drum portion mount 240, by first separating the drum portion into the three segments 15 as shown in FIG. 3 and then assembling in a cylindrical form by mounting the segments 15 one at a time on to the drum portion mount 240 shown in FIG. 1, the operation of mounting the drum portion 12 can be lightened in comparison to current techniques where the very heavy drum portion 12 is lifted and then mounted as one single portion. Furthermore, as shown in FIG. 2, an annular engagement protrusion 245 for engaging with the annular positioning recess 14 in the bottom surface of the drum portion 12 of the support base 10 is provided on the upper surface of the drum portion mount 240, and the inner face of the engagement protrusion 245 comprises the guide face 245a which gradually widens in an upward direction. As a result, by positioning the segments 15 while engaging the annular positioning recess 14 in the bottom surface of each segment 15 with the guide face 245a of the engagement protrusion 245, each of the segments 15 shown in FIG. 3 can be easily mounted at the predetermined positions, as shown in FIG. 2. That is, the centerline of the engagement aperture 13 of the assembled drum portion 12 can be easily aligned with the centerline of the aperture 243 of the drum portion mount 240. Consequently, the mounting of the drum portion 12 of the support base 10 onto the drum portion mount 240 can be completed easily.

Furthermore, because the bottom portion 11 of the support base 10 and the bottom portion mount 230 have, respectively, a positioning recess 11c and a positioning protrusion 231 which engage with each other, the operation of mounting the bottom portion 11 of the support base 10 so that the center of the bottom portion 11 is aligned, with a high degree of accuracy, with the center of the bottom portion mount 230 can also be completed easily.

The crucible 1 shown in FIG. 1 is mounted so that the centerline of the crucible aligns with the centerline of the bottom portion 11 of the support base 10. The drum portion mount 240 is then raised up in the direction of the arrow M in the figure by operating the mount hydraulic jacks 251 of the support base assembly apparatus 200. In so doing, the drum portion 12 of the support base 10 which is mounted on the drum portion mount 240 gradually rises up and covers the perimeter of the crucible 1, with the internal surface of the drum portion 12 eventually contacting the external surface of the crucible 1. Furthermore at the same time, the bottom portion 11 which is mounted on the bottom portion mount 230 is engaged in the engagement aperture 13 of the drum portion 12. Since the external engagement surface 11a of the bottom portion 11 and the engagement surface 13a of the engagement aperture 13 of the drum portion 12 have sloping surfaces 11b, 13b respectively, which are tapered in a downward direction as shown in FIG. 2, then the drum portion 12 is guided relative to the bottom portion 11 by the sloping surfaces 11b, 13b. Consequently, the aforementioned engagement can be carried out simply and smoothly. Furthermore the sloping surfaces 11b, 13b prevent the bottom portion 11 from dropping down from the drum portion 12 during transport of the support base following assembly, and so besides the engagement, no joining operation is required. Consequently, the assembly of the support base 10 can be completed simply and quickly.

Furthermore, with the method outlined above, the support base 10 is separated into the bottom portion 11 and the drum portion 12, the drum portion 12 being attached to the bottom portion 11 of the support base 10 after the crucible 1 has been mounted onto the bottom portion 11.

Therefore, as shown in FIG. 1, the crucible 1 can be grasped by the middle portion or the lower portion of the drum portion 2 of the crucible 1 during the mounting of the crucible 1 onto the bottom portion 11 of the support base 10. Consequently, the crucible 1 can be easily supported.

With the present embodiment, the effects described above mean that the operation of attaching the crucible 1 to the support base 10 can be completed safely, simply and quickly.

The present invention also includes those cases where the base carriage 210 employed in the aforementioned support base assembly apparatus 200 is replaced by a fixed base.

Moreover, instead of using the aforementioned drive mechanism 250, an approach drive mechanism where the bottom portion mount 230 is moved towards the drum portion mount 240 so as to assemble together the bottom portion 11 and drum portion 12 of the support base 10, is also possible.

Furthermore, the drum portion 12 need not necessarily be configured of three segments 15 as shown in FIG. 3, and configurations comprising two segments, or four or more segments are also possible. Moreover, the present invention also includes those configurations where the drum portion 12 is a single body which cannot be divided into segments.

As outlined above, with the method of the present invention for attaching a crucible 1 to a support base 10, the crucible 1 can be grasped and held by the middle portion or the lower portion of the drum portion 2 of the crucible 1 until the point where the crucible 1 is mounted on the support base 10, and so supporting the crucible 1 is simple. Consequently, the operation of attaching the crucible 1 to the support base 10 can be completed safely, simply and quickly.

Furthermore, because the support base 10 assembly apparatus of the present invention enables the operation of assembling the support base 10 by fitting the drum portion 12 onto the bottom portion 11 of the support base 10 to be completed simply and quickly, it enables the operation of attaching the crucible 1 to the support base 10 to be completed with even greater safety, ease and speed.

Moreover with the support base 10 of the present invention, the assembling of the bottom portion 11 and the drum portion 12 by engaging the engagement aperture 13 of the drum portion 12 onto the bottom portion 11 can be carried out simply and smoothly due to the sloping surfaces 11b, 13b which act as guide faces. Furthermore, following engagement, the sloping surfaces 11b, 13b become support surfaces for the drum portion 12 and prevent the bottom portion 11 from dropping down from the drum portion 12, and so besides the engagement, no joining operation is required. Consequently, the assembly of the support base 10 can be completed simply and quickly, and it allows the operation of attaching the crucible 1 to the support base 10 to be completed with even greater safety, ease and speed.

What is claimed is:

1. A method of attaching a crucible to a support base of a single crystal pulling apparatus, said method comprising:

partitioning a support base into a bottom portion;

mounting a crucible for storing a semiconductor melt on said bottom portion; and subsequently assembling said support base by attaching said drum portion to said bottom portion.

2. A support base assembly apparatus for attaching a crucible to a support base of a single crystal pulling apparatus, said support base assembly apparatus comprising:

a support base comprising a support bottom portion and a support drum portion, said support drum portion operatively attachable to said support bottom portion;

a bottom portion mount on which the support bottom portion of said support base is mounted;

a drum portion mount on which the support drum portion of said support base is mounted; and an approach drive mechanism for bringing the bottom portion mount and the drum portion mount together to thereby assemble the support bottom portion and the support drum portion of said support base.

3. The support base assembly apparatus according to claim 2, wherein an annular positioning recess is formed in a bottom surface of said support drum portion, and an annular engagement protrusion which engages with said annular positioning recess of said support drum portion, and an inner face of which acts as a guide face which gradually widens in an upward direction, is provided on an upper surface of said drum portion mount.

4. A support base for attaching a crucible to a support base of a single crystal pulling apparatus, said support base comprising:

a bottom portion having an external engagement surface; and a drum portion, said drum portion having an engagement aperture into which the bottom portion fits, said engagement aperture having an engagement surface, and said external engagement surface of said bottom portion and said engagement surface of the engagement aperture of said drum portion have sloping surfaces which are tapered in a downward direction.

5. The support base of claim 4, wherein said drum portion of the support base comprises a plurality of segments which divide said drum portion around a circumferential direction.

* * * * *